US008705904B2

(12) United States Patent
Kish, Jr. et al.

(10) Patent No.: US 8,705,904 B2
(45) Date of Patent: Apr. 22, 2014

(54) PHOTONIC INTEGRATED CIRCUITS HAVING CHIRPED ELEMENTS

(75) Inventors: Fred A. Kish, Jr., Palo Alto, CA (US); Mehrdad Ziari, Pleasanton, CA (US); Radhakrishnan L. Nagarajan, Cupertino, CA (US); Masaki Kato, Palo Alto, CA (US); Vincent G. Dominic, Dayton, OH (US); Sanjeev Murthy, Sunnyvale, CA (US); Alan Nilsson, Mountain View, CA (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 12/263,471

(22) Filed: Nov. 1, 2008

(65) Prior Publication Data
US 2009/0175573 A1    Jul. 9, 2009

Related U.S. Application Data

(60) Continuation-in-part of application No. 11/556,278, filed on Nov. 3, 2006, now Pat. No. 7,526,150, which is a division of application No. 11/268,325, filed on Nov. 7, 2005, now Pat. No. 7,162,113, which is a continuation-in-part of application No. 10/267,331, filed on Oct. 8, 2008, now Pat. No. 7,283,694, and a continuation-in-part of application No. 10/267,330, filed on Oct. 8, 2002, now Pat. No. 7,079,715, and a continuation-in-part of application No. 10/267,304, filed on Oct. 8, 2002, now Pat. No. 7,116,851.

(60) Provisional application No. 60/625,322, filed on Nov. 5, 2004.

(51) Int. Cl.
G02B 6/12      (2006.01)
H04J 14/02     (2006.01)
H04B 10/04     (2006.01)
H04B 10/12     (2006.01)

(52) U.S. Cl.
USPC ............................ 385/14; 398/79; 398/182

(58) Field of Classification Search
USPC ................ 385/14; 398/91, 79, 182
See application file for complete search history.

(56) References Cited

U.S. PATENT DOCUMENTS 5,432,123 A * 7/1995 Dentai et al. ............... 438/24
5,612,968 A * 3/1997 Zah ........................... 372/50.12

(Continued)

FOREIGN PATENT DOCUMENTS

JP    4-206982 A  *  7/1992    ............ H01S 3/18
JP    4-364084 A  * 12/1992    ............ H01S 3/18

OTHER PUBLICATIONS

"A 16 × 1 wavelength division multiplexer with integrated distributed Bragg reflector lasers and electroabsorption modulators," by Young et al, IEEE Photonics Technology Letters, vol. 5, No. 8, pp. 908-910, Aug. 1993.*
"Monolithic integration of multiple-quantum-well lasers and modulators for high-speed transmission," by Ramdane et al, IEEE Journal of Selected Topics in Quantum Electronics, vol. 2, No. 2, pp. 326-335, Jun. 1996.*

(Continued)

Primary Examiner — Ryan Lepisto
Assistant Examiner — Robert Tavlykaev
(74) Attorney, Agent, or Firm — David L. Soitz

(57) ABSTRACT

Consistent with the present disclosure, optical devices are provided along different optical paths in a photonic integrated circuit (PIC). The optical components have different optical losses associated therewith so that optical signals propagating in the optical paths have desired power levels, which may be uniform, for example.

10 Claims, 7 Drawing Sheets

(56) References Cited

U.S. PATENT DOCUMENTS

| | | | |
|---|---|---|---|
| 5,689,358 A * | 11/1997 | Nakao et al. | 359/248 |
| 5,770,466 A * | 6/1998 | Sasaki et al. | 438/31 |
| 6,970,494 B1 * | 11/2005 | Bendett et al. | 372/102 |
| 2002/0131466 A1 * | 9/2002 | Salvatore et al. | 372/50 |
| 2009/0060520 A1 * | 3/2009 | Cole et al. | 398/140 |

OTHER PUBLICATIONS

"Integrated electroabsorption attenuator-photodetector for optical power control in WDM transmission systems," by Densmore et al, IEEE Journal of Selected Topics in Quantum Electronics, vol. 8, No. 6, pp. 1435-1444, Nov. 2002.*

* cited by examiner

PHOTONIC INTEGRATED CIRCUITS HAVING CHIRPED ELEMENTS

This application is a continuation-in-part of U.S. patent application Ser. No. 11/556,278, which is a divisional of U.S. application Ser. No. 11/268,325, which is a continuation-in-part of U.S. patent application Ser. No. 10/267,331, filed Oct. 8, 2002 and entitled, TRANSMITTER PHOTONIC INTEGRATED CIRCUITS (TxPIC) AND OPTICAL TRANSPORT NETWORKS EMPLOYING TxPICs, also published on May 22, 2003 as Pub. No. US2003/0095737 A1; U.S. patent application Ser. No. 10/267,330, filed Oct. 8, 2002 and entitled, TRANSMITTER PHOTONIC INTEGRATED CIRCUIT (TxPIC) CHIP ARCHITECTURES AND DRIVING SYSTEMS AND WAVELENGTH STABILIZATION FOR TxPICs, also published on May 22, 2003 as Pub. No. US2003/0095736 A1; and U.S. patent application Ser. No. 10/267,304, filed Oct. 8, 2002 and entitled, AN OPTICAL SIGNAL RECEIVER PHOTONIC INTEGRATED CIRCUIT (RxPIC), AN ASSOCIATED OPTICAL SIGNAL TRANSMITTER PHOTONIC INTEGRATED CIRCUIT (TxPIC) AND AN OPTICAL TRANSPORT NETWORK UTILIZING THESE CIRCUITS, also published on Feb. 19, 2004 as Pub. No. US2004/0033004 A1, and, further, claims priority to provisional patent application Ser. No. 60/625,322, filed Nov. 5, 2004, all which applications are incorporated herein in their entirety by reference.

DESCRIPTION OF THE INVENTION

Background of the Invention

Wavelength division multiplexed (WDM) optical communication systems are known in which multiple optical signals, each having a different wavelength, are combined onto an optical fiber, for example. Such systems often include discrete optical components, such as lasers, modulators, combiners that generate and multiplex the optical signals. More recently, photonic integrated circuits have been developed in which these components have been integrated onto a common substrate.

For example, conventional photonic integrated circuits may include a plurality of lasers, such as distributed feedback (DFB) lasers, which output optical signals that are modulated and/or attenuated by other components provided on a substrate and then combined by an optical combiner into a WDM signal. Due to systematic variations, as well as process variations, optical signals output from the PIC may have undesirable optical characteristics. For example, the power levels of one or more optical signals output from the PIC may be too low or too high, resulting in an inadequate signal quality. Conventionally, such characteristics may be improved by providing additional control circuitry on the PIC, but at the expense of decreased yields, and increased complexity and cost.

Accordingly there is a need for a photonic integrated circuit having a simplified design that provides improved optical characteristics.

SUMMARY OF THE INVENTION

In accordance with the present disclosure, a photonic integrated circuit is provided that includes a substrate and a plurality of optical paths provided on the substrate. Each optical path includes a corresponding one of a plurality of optical devices and is configured to carry a corresponding one of a plurality of optical signals. Each of the plurality of optical signals has a corresponding one of a plurality of wavelengths, and each of the plurality of optical devices has a corresponding one of a plurality of optical loss values. Each of the plurality of optical loss values is different from one another, such that each of the plurality of optical signals has a corresponding one of a plurality of predetermined optical power values.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate one (several) embodiment(s) of the invention and together with the description, serve to explain the principles of the invention.

DESCRIPTION OF THE EMBODIMENTS

Consistent with the present disclosure, optical devices are coupled along optical paths on a photonic integrated circuit, and parameters of each optical device are "chirped" or varied from one optical path to the next so that optical signals output from the photonic integrated circuit have desired characteristics or PIC "output characteristics". As used herein, "optical devices" include, but are not limited to, optical laser sources, optical modulators, modulated laser sources, amplitude varying devices such as semiconductor optical amplifiers, variable optical attenuators, or photodetectors, or other guided wave structures. As used herein, "parameters" of an optical device may comprise design parameters which may include device and waveguide dimensions such as length, width, height, and shape; operating parameters which may include an applied bias such as a current or a voltage applied to the optical device, or an operating temperature; or material parameters such as doping. These parameters control or change the "characteristics" of the optical signal as the optical signal propagates along the corresponding optical path. Moreover, as used herein, "characteristics" include, for example: loss or gain, optical power, threshold current, spectral properties, phase or modal characteristics (e.g., mode shape). In addition to each of these characteristics, in the case of an optical modulator or a semiconductor optical amplifier, the characteristics may also include frequency chirp, extinction ratio, overshoot, or other signal distortions. As used herein, PIC output characteristics include output power from the PIC, signal quality, linewidth, signal to noise ratio (SNR) and the corresponding bit error rate at the receiver. Such chirping of the optical device characteristics may be achieved by changing the dimensions, such as the length and/or width of each device, such that the dimension is not constant from one optical path to the next or changing the bias (e.g., bias voltage or potential) applied to the optical devices from one path to the next. Alternatively, a combination of biasing and dimension variation can be used to appropriately chirp the optical device parameters.

Further consistent with the present disclosure, PIC output characteristics can be achieved with less PIC power consumption and a greater improvement in these characteristics can be achieved. Moreover, tradeoffs can be realized that could not be achieved without other additional comprises (e.g., adding more loss, adding more elements on the PIC, and consuming more power).

Reference will now be made in detail to the present exemplary embodiments of the disclosure, examples of which are illustrated in the accompanying drawings. Wherever possible, the same reference numbers will be used throughout the drawings to refer to the same or like parts. In the following discussion, the term "optical loss" is intended to mean an optical loss and/or optical gain.

Figure 1:
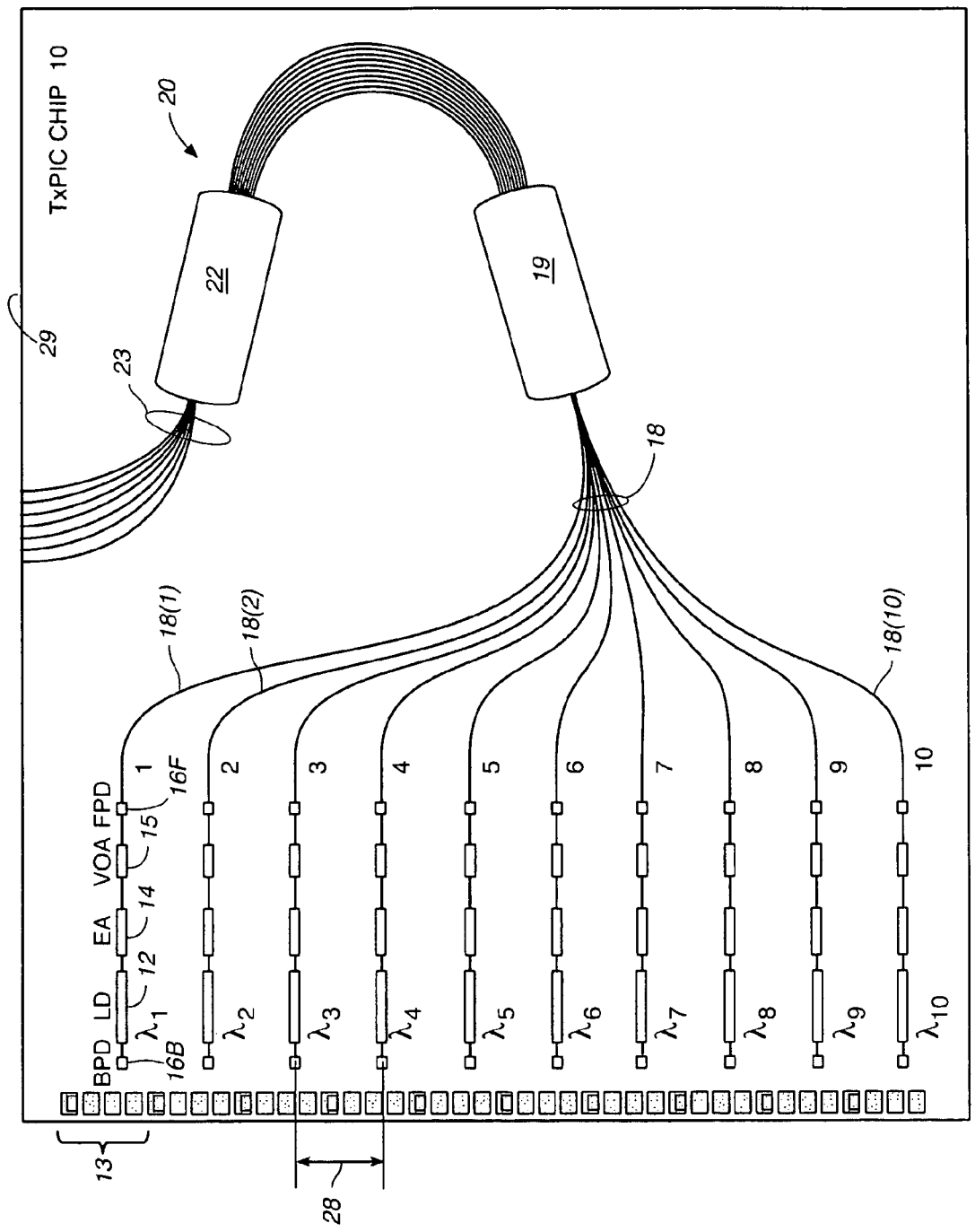
FIG. 1 is a plan view of a PIC in accordance with an aspect of the present disclosure.

Reference is now made to FIG. 1 comprising a photonic integrated circuit (PIC), here also referred to as a transmitter PIC or TxPIC. It should be noted that some of the attributes of this invention are equally applicable to any other PICs, such as optical receiver photonic integrated circuit (RxPIC) chips which are disclosed in U.S. patent application Ser. No. 10/267,304, supra, examples of which are also discussed in later described embodiments, and any other such PICs having integrated active or electro-optic components as well as one or more passive optical components.

TxPIC chips 10 as well as such PIC chips in other embodiments disclosed are an In-based chip, various details of which are disclosed in U.S. patent application Ser. No. 10/267,331, supra. As shown in FIG. 1, PIC chip 10 includes a substrate 29, made of InP, for example, and groups of integrated and optically coupled active and passive components (optical devices) typically formed in a series of signal channels or optical paths 1-10 on the substrate. Each of optical paths 1-10 includes a laser or optical source 12, such as a DFB semiconductor laser or a DBR semiconductor laser. Each laser source 12 operates at a different emission wavelength, $\lambda_1$ to $\lambda_N$ where N in the exemplary embodiment here is equal to ten. The group of wavelengths $\lambda_1$ to $\lambda_N$ provides a wavelength grid with predefined grid channel spacing that may be commensurate with a standardized wavelength grid, such as the ITU wavelength grid. However, such a wavelength grid may also be a non-standard wavelength grid or a wavelength grid with non-uniform channel spacing. On the other hand, the wavelength grid need not be of any particular standard. Moreover, as discussed in greater detail below, the parameters associated with each optical device coupled along the optical paths 1-10 preferably conforms to predetermined values.

As further shown in FIG. 1, each of laser sources 12 has a corresponding electro-optic modulator 14 within a corresponding one of optical paths 1-10. Thus, the CW outputs of laser sources 12 are shown optically coupled to respective electro-optic modulators 14. Modulators 14 may be electro-absorption modulators (EAMs) or Mach-Zehnder modulators (MZMs) as detailed in patent application Ser. No. 10/267,331, supra. It is within the scope of this disclosure that, rather than deploying modulators 14, laser sources 12 may be directly modulated, and, in that case, modulators 14 may be omitted. Thus, channel "modulated sources" may be defined as a modulated laser source or a CW operated laser source with a modulated external modulator.

Modulators 14 modulate the CW light from laser sources 12 in accordance with a received electrical signal, thereby producing an optical modulated signal for transmission on an optical link of an optical transmission network. The modulated channel outputs from modulators 14 may be optically coupled to a front photodetector (FPD) 16F, typically for the purposes of monitoring the output power or signal characteristics received from the modulators 14. The on-chip deployment of FPDs 16F is optional. FPDs 16F may also be fabricated off-axis of the channel of in-tandem optical train elements by means of an on-chip channel optical tap to provide a small portion of the modulated output to the offset photodetector. Also shown in FIG. 1, back photodetectors (BPDs) 16B are provided in each of optical paths 1-10 to monitoring light from the back facet of laser sources 12 and to aid in or provide for the determination of laser CW output power in each of optical paths 1-10. FPDs 16F and BPDs 16B may be PIN photodiodes, MSM photodetectors, or avalanche photodiodes (APDs). Each of optical paths 1-10 may also include an electro-optical amplitude varying element (AVE), such as variable optical attenuator (VOA) 15. While in this and other embodiments, the train of elements is numerically identified for only channel 1 in the figures, it should be understood in this description that they are the same for all the remaining signal channels 2 through 10.

As indicated above and as explained in more detail in patent application Ser. No. 10/267,331, supra, modulators 14 may be electro-absorption modulators (EAMs), Mach-Zehnder modulators (MZMs) or bandedge Mach-Zehnder modulators. The modulated optical signals (each having a different wavelength) output of modulators 14, via FPDs 16F, are respectively coupled, via waveguides 18(1) ... 18(10), to an on-chip wavelength selective combiner, shown here as an arrayed waveguide grating or AWG 20. Waveguides 18(1) ... 18(10) receive the modulated channel signals from the N channels and provide them as an input to an optical combiner, such as AWG 20. It is within the scope of this disclosure that other combiners may be used, such as Echelle gratings, cascaded Mach-Zehnder interferometers (MZIs), broadband multiplexers of the type shown, for example, in U.S. Pat. No. 6,580,844 (which is also incorporated herein by its reference), so-called free-space diffraction gratings (FS-DGs) or quasi-selective wavelength star couplers having a multimode coupling region comprised of waveguides as disclosed in U.S. patent application, publication No. US2003/0012510 A1 (which patent application is also incorporated herein by its reference). In FIG. 1, the output of each signal channel from a respective channel laser/modulator is coupled to a respective waveguide 18(1) to 18(10) which is optically coupled to the zero order Brillouin zone input of AWG 20.

Each optical signal or channel is typically assigned a minimum channel spacing or bandwidth to avoid unacceptable crosstalk with other optical channels. For example, 50 GHz, 100 GHz, or 200 GHz are common channel spacings between signal channels. The physical channel spacing or center-to-center spacing 28 of optical paths 1-10 may be 100 μm to 1,000 μm or more to minimize electrical or thermal cross-talk at data rates, for example, of 10 Gbit per second or greater and facilitate routing of interconnections between bondpads of multiple PIC optical components or elements. Although not shown for the sake of simplicity, bonding pads may be provided in the interior of PIC chip 10 to accommodate wire bonding to particular on-chip electro-optic components in addition to bond pad groups 13 comprising chip edge-formed bonding pads. Moreover, PIC chip 10 preferably includes a selectively deposited insulative or passivation medium to provide electrical isolation for each bondpad.

Metal interconnects between bondpads (not shown) and electro-optic components are at least partly formed on a surface of an isolation or passivation medium deposited over PIC chip 10. A dielectric medium is often employed to passivate and to provide for uniform planarization of the surface of chip 10. Such a passivation medium may be, for example, $SiO_x$, $SiN_x$, polyimide, BCB, ZnS, ZnSe or SOG or as combination of one or more of the foregoing mediums.

As indicated above, the respective modulated outputs from electro-optic modulators 16 are coupled into optical waveguides 18(1) to 18(10) to the inputs of AWG 20, which combines the received modulated output optical signals into a wavelength division multiplexed signal in a known manner. One of output waveguides 23 supplies the wavelength division multiplexed signal for output form TxPIC 10.

Turning attention again to electro-optic amplitude varying elements (AVEs), which in FIG. 1, is a variable optical attenuator (VOA), but also may be a semiconductor optical amplifier (SOA), an in-series or in-tandem variable optical attenuator (VOA) and a semiconductor optical amplifier (SOA), or a combination, variable optical attenuator/semiconductor optical amplifier, which may be referred to as a ZOA, which is a combined SOA/VOA and operates as either as a gain element or a passive element depending upon whether the applied bias is positive or negative, respectively. In FIG. 1, VOA 15 follows electro-absorption modulator (EAM) 14. In that case, the array of VOAs 15 may provide for pre-emphasis directly on chip 10 across the array of channel signals so that the output modulated signals from EAMs 14 are all approximately at the desired power levels upon exiting the output of AWG 20. The desired power levels can be uniform or flat, tilted or have any shape that has desired transmission characteristics of the system. VOA 15 in each signal channel 1 to 10 can operate to change the signal amplitude in a channel by employing monitoring FPD 16F to provide an output in the form of a monitoring signal proportional to signal power to system control circuit 40 which compares the same monitoring signals from other FPDs 16F in other signal channels to provide, for example, signal attenuation to those channel signals having higher signal strength over the weakest of all such channel signals.

The operation of PIC 10 may require optimization of gain and loss along the optical path (1-10) in order, for example, to a) control the output power of the PIC exiting AWG and b) control the input power to the AVE elements in FIGS. 1 (and 2) because amplifiers and modulators are sensitive to incident optical input power. For example, it is known that SOA saturation properties and the resulting signal shape and distortion is dependent upon the input power level and the gain. Similarly, the modulation characteristics of EAM or VOAs saturate at high optical power levels. As a result, it is desired to have control on the optical power level along the path of the signal in addition to the output of AWG 20.

Figure 2:
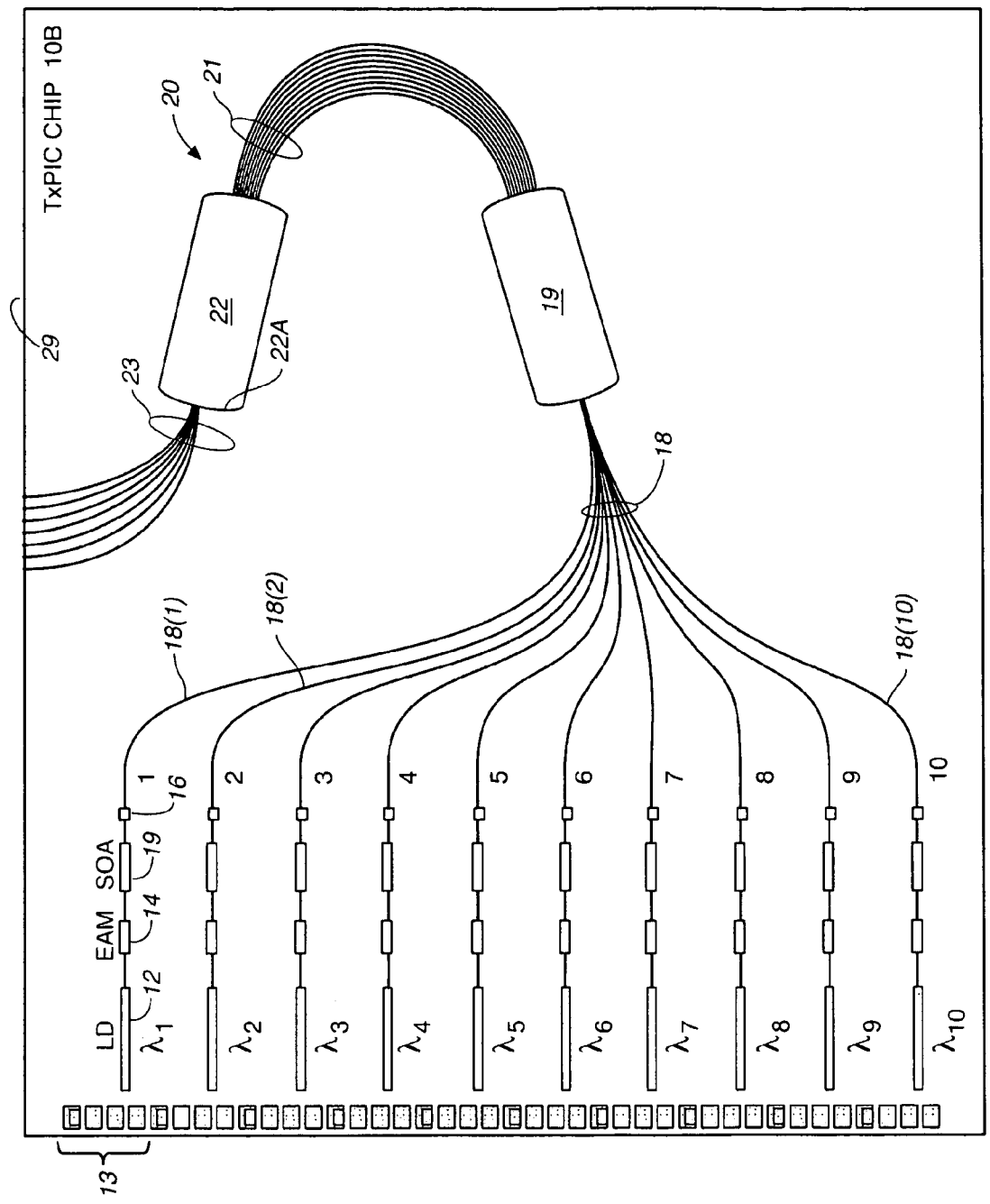
FIG. 2 is a plan view of PIC in accordance with a further aspect of the present disclosure.

As shown in FIG. 2, consistent with a further aspect of the present disclosure, a plurality of semiconductor optical amplifiers (SOAs) may be provided at the output of each EAM 14 instead of or in addition to VOAs 15.

Due to systematic and/or process variations, the output characteristics of optical signals supplied by the PIC may not conform to desired values. In order adjust such optical output characteristics, and as discussed above, the optical parameters associated with each optical device (e.g., EAM, VOA, SOA, FPD) along a given optical path (1-10) are preferably adjusted so that each optical channel has the predetermined desired value. For example, in certain circumstances, each optical channel should preferably have the same optical power. In order to simplify various circuitry components required to control DFBs 12 and/or other components in each optical path, the optical parameters may be adjusted or chirped from one optical path to the next. Examples of chirped optical devices will be discussed in greater detail below with reference to FIGS. 3a, 3b, and 4-6.

For convenience, the width and length of EAMs 14, SOAs 19, VOAs 15 and FPDs 16F are shown as having uniform length and width in FIGS. 1 and 2. In one example, the lengths and widths of one or more of these devices, however, may actually different in each optical path so that optical parameters associated with the optical devices changes from one optical path to the next. For example, the loss and extinction ratio of an EAM increases as the device length increases. As a result, optical signals supplied from PIC 10 have desired output characteristics. The following examples are directed toward varying lengths and or widths of the optical devices to obtain a desired optical parameter.

Figure 3A:
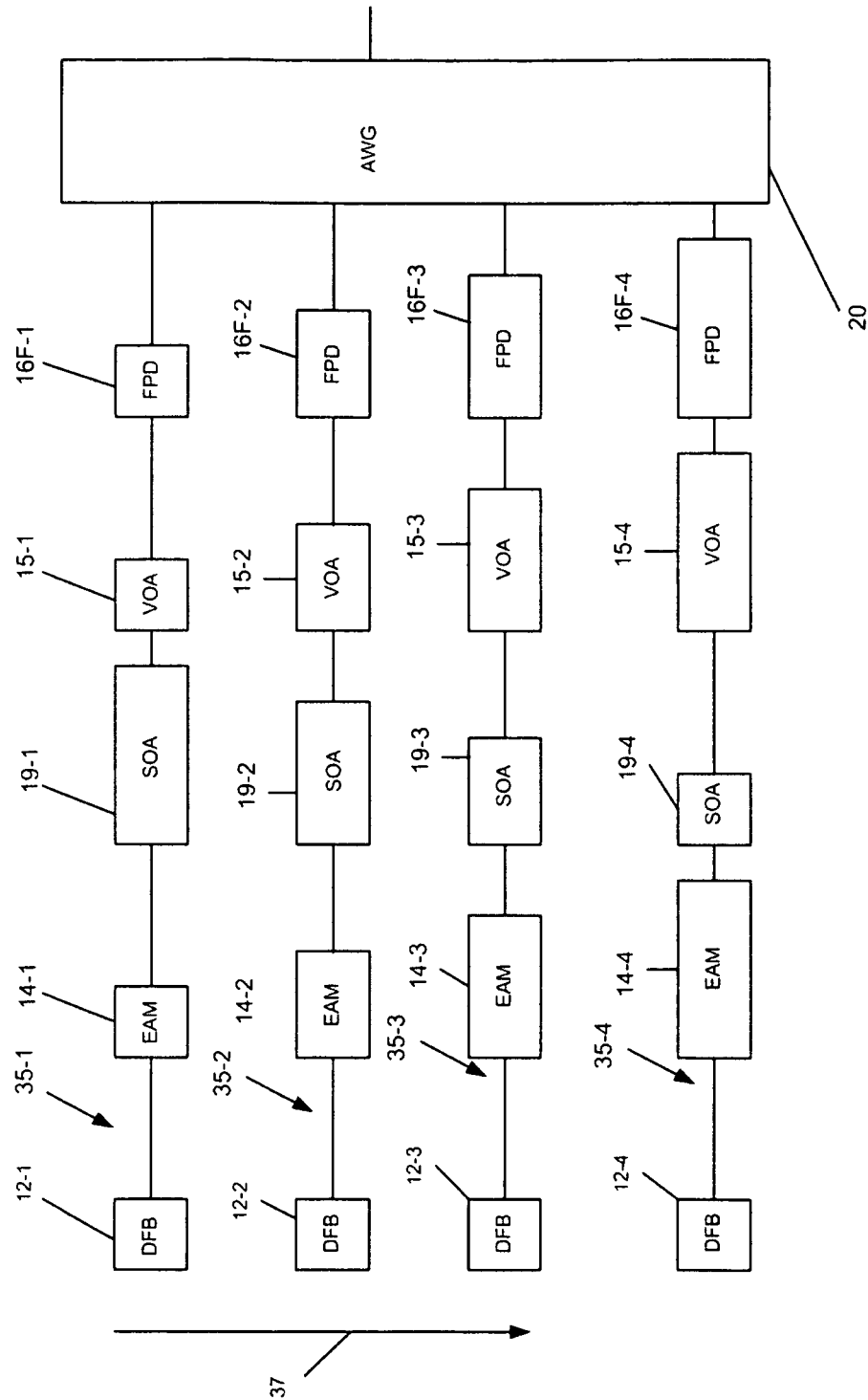
FIGS. 3a and 3b illustrates plan views of optical devices of a PIC consistent with an additional aspect of the present disclosure.

In FIG. 3a, optical signals (each having a different wavelength) propagate along optical paths 35-1 to 35-4 in a direction from DFBs 12-1 to 12-4 to AWG 20. If the optical parameters of DFBs 12-1 to 12-4 (e.g., output power) and the resulting output characteristics (e.g., powers) of each optical signal output from AWG 20 monotonically increases in value in a direction indicated by arrow 37, the optical parameters of the remaining optical devices in the corresponding optical paths 35-1 to 35-4 may be adjusted in that direction. The variations indicated by arrow 37 may be due to, for example, variations in total loss due to optical path length variations, as better depicted with reference to the path length variations of waveguides 18(1) to 18(10) in FIGS. 1 and 2, or systematic process variations in the substrate along the direction indicated by arrow 37. In order to achieve such optical characteristics, the lengths of each of optical devices EAMs 14-1 to 14-4 may be monotonically increased in the direction indicated by arrow 37, as shown in FIG. 3. The amount of the optical parameters are adjusted may also be increased by increasing the lengths of VOAs 15-1 to 15-4 and forward photodiodes 16F-1 to 16F-4 in the direction indicated by arrow 37. Alternatively, if the DFB characteristics (and corresponding output power of AWG 20) vary in a direction opposite that of arrow 37 or any other direction, the length variations discussed above may be reversed, whereby EAM 14-1, for example, has a longer length than EAM 14-4.

Figure 3B:
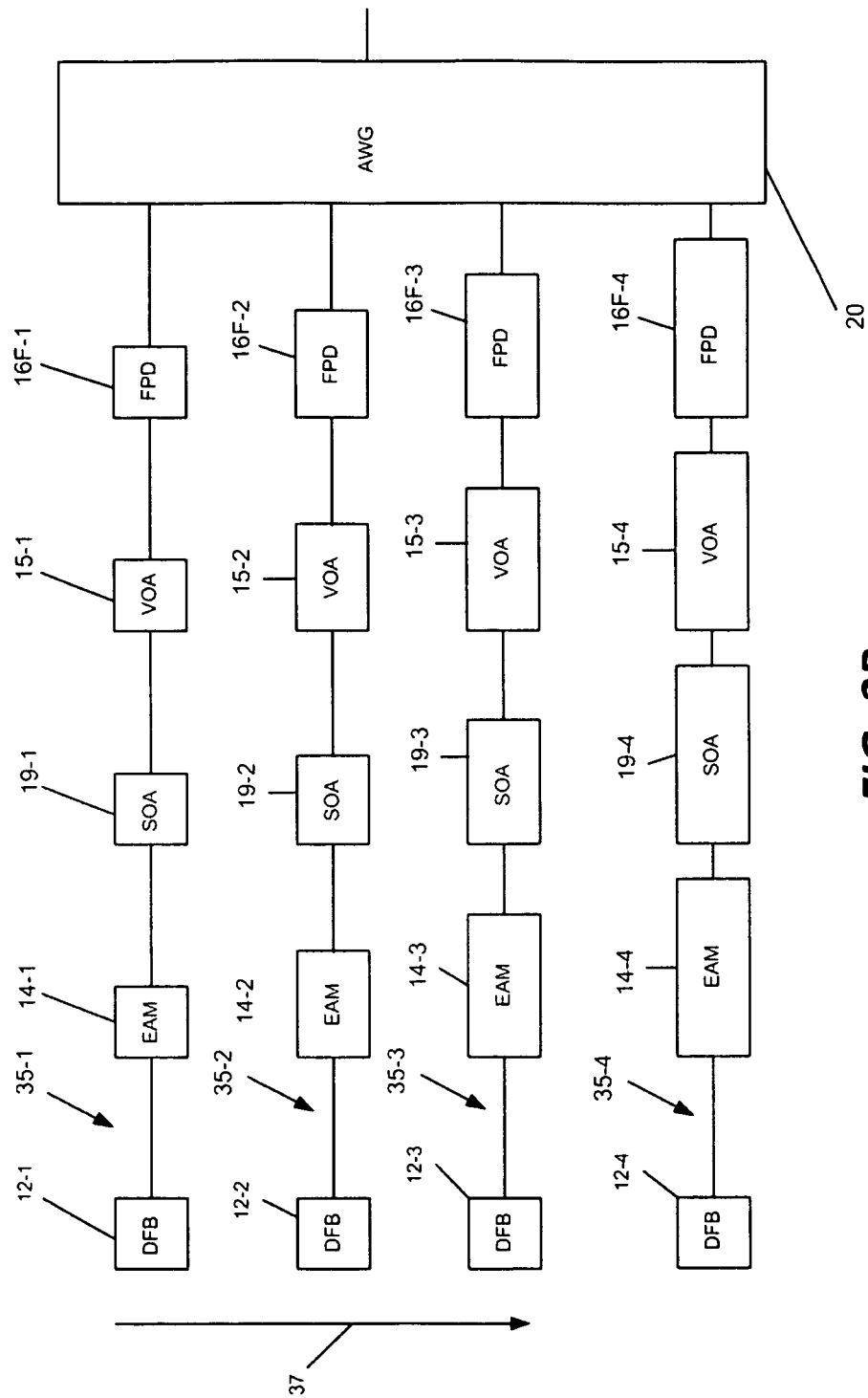

In addition, the amount of gain imparted by SOAs 19-1 to 19-4 may also be varied from one optical path to the next by changing the length of each SOA. One example, of such variations in SOA lengths is shown in FIG. 3a. Another variation is shown in FIG. 3b. Either variation may be selected depending on the desired optical profile along the signal path or the output characteristics of the optical signals supplied by AWG 20.

Thus, in the examples shown in FIGS. 3a and 3b, light from DFB 12-1 that is output from AWG 20 has output characteristics different that that of light originating from DFB 12-4. Accordingly, EAM 14-4, VOA 15-4 and FPD 16F-4 may be made relatively long compared to corresponding optical devices EAM 14-1 VOA 15-1 and FPD 16F-1, respectively. As a result, the output characteristic of optical signals originating from DFB 12-1 and DFB 12-4 may have desired values.

It is noted that each of VOAs 19-1 to 19-4 may further attenuate optical signals propagating in optical signal paths 35-1 to 35-4. An advantage of the present disclosure, therefore, permits an appropriate fixed or baseline adjustment of optical parameters after TxPIC 10 has been manufactured, and, as DFBs 12-1 to 12-4 age and the optical characteristics thereof fluctuates over time, VOAs 15-1 to 15-4 can provide further attenuation so that the desired optical power levels, for example, or other optical characteristics, are maintained.

Figure 4:
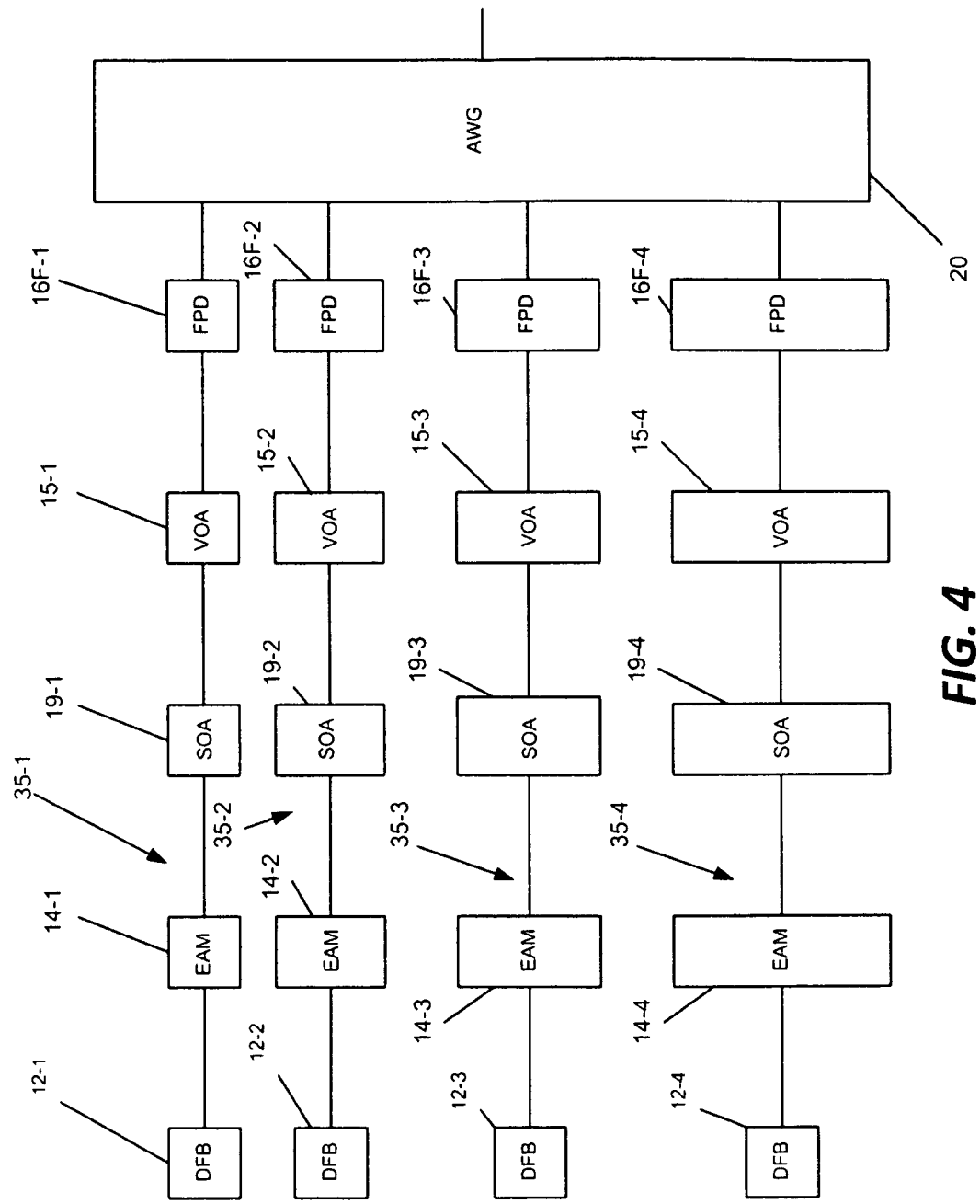
FIG. 4 illustrate a plan view of optical devices of PIC consistent with another aspect of the present disclosure.

FIG. 4 illustrates another example in which the widths (which extend in a direction perpendicular, in this example, the direction of propagation) of each of optical devices 14-1 to 14-4; 19-1 to 19-4; 15-1 to 15-4; and 16F-1 to 16F-4; are different in order to adjust the loss the associated with optical signals propagating in optical paths 35-1 to 35-4.

In changing the widths of each optical device, care preferably should be taken to ensure that optical devices 14, 15, 16F, and 19 support a desired optical mode or do not scatter light substantially into higher order modes.

Although in FIGS. 3 and 4 each of the EAMs, SOAs, VOAs, and FPDs have different lengths or widths from one path to the next, it is understood that both the length and the width may be varied from one optical path to the next. In addition, other dimensions of these devices may be changed from one optical path to the next. Further, the length and width may be varied for only one type of optical device (e.g., the EAMs), while the remaining optical devices in each optical path may have the same length and width (e.g., the length and width of the SOAs in each optical may be the same).

Moreover, although only four optical paths are described above in regard to FIGS. 3 and 4, it is understood that the optical devices shown in each of optical paths 1 to 10 in FIGS. 1 and 2 may be varied in length and/or width in order to obtain desired optical parameters and corresponding output characteristics. In addition, the doping in each optical device may be varied to obtain desired loss values as well. Moreover, the bias to each optical devices may also be changed from one optical path to the next in order to appropriately chirp the optical parameters associated with such devices.

In each of the above embodiments, optical parameters associated with optical devices 14, 19, 15 and 16F are chirped or varied across the optical paths. It is understood, however, that optical parameters associated with DFB lasers 12 may also be varied as the loss across the optical paths change. For example, the DFB output power can be varied in accordance with losses of the optical path following the DFB.

Other embodiments of the invention will be apparent to those skilled in the art from consideration of the specification and practice of the invention disclosed herein.

For example, it is contemplated that the lengths of the optical devices may be selected to yield any desired distribution of optical parameters, such as optical loss or power.

Accordingly, in a further embodiment, optical loss values may be monotonically increased over a first set of optical components passing a first group of optical signals in a corresponding first group of optical paths, and a second set of optical components associated with a second group of optical paths may have the same monotonically increasing loss pattern and pass a second group of optical signals (having different wavelengths than the first group). Accordingly, for example, the series of optical paths shown in FIG. 3 may be repeated on the same substrate as the second group of optical paths to thereby feed the second group of optical signals to AWG 20.

Figure 5:
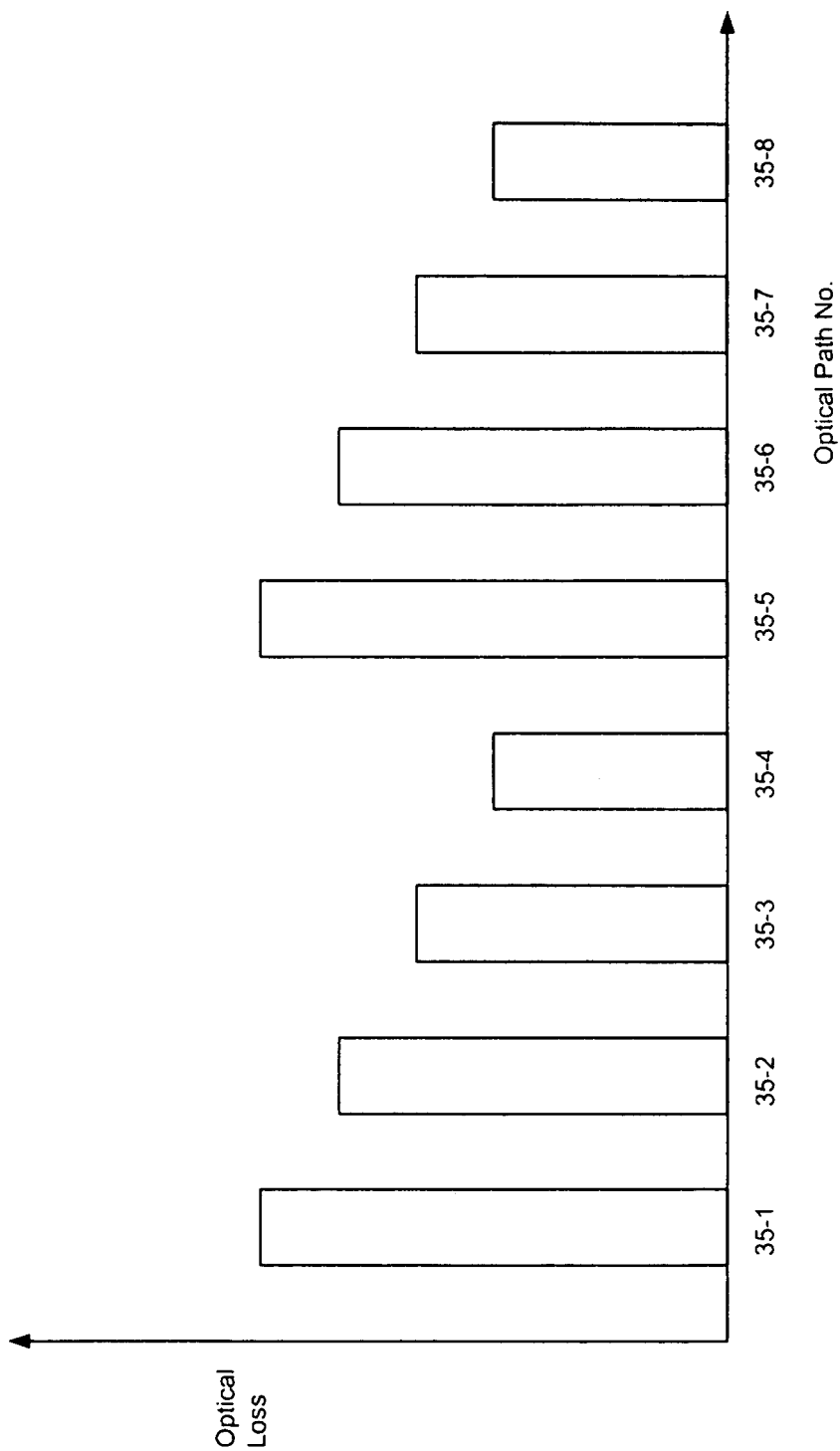
FIG. 5 illustrates an example of a loss a pattern consistent with the present disclosure.
Figure 6:
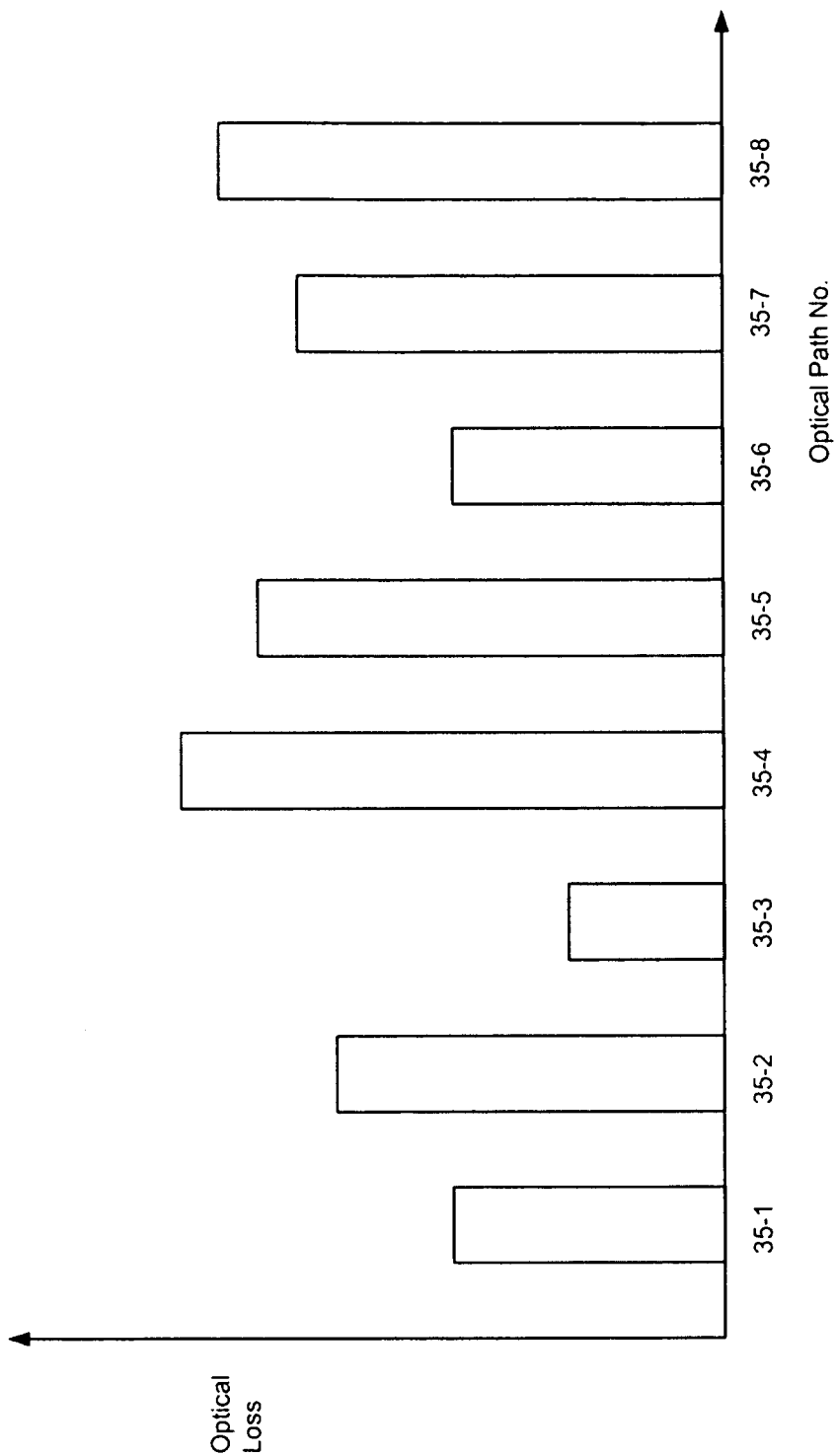
FIG. 6 illustrates another example of a loss pattern consistent with the present disclosure.

For example, as shown in FIG. 5, optical loss may increase monotonically from optical path 35-1 to optical path 35-4 (carrying wavelengths $\lambda_1$, to $\lambda_4$, for example) and this loss pattern may repeat over additional optical paths 35-5 to 35-8 (not shown in FIGS. 3 and 4), carrying wavelengths $\lambda_5$ to $\lambda_8$, for example.

It is understood, however, the present disclosure is not limited to the monotonically increasing loss patterns discussed above. Rather, it is contemplated that the lengths and widths (and biases) of the optical devices coupled along the optical paths on a PIC may be varied to obtain any desired optical loss pattern, as shown, for example, in FIG. 6.

It is intended that the specification and examples be considered as exemplary only, with a true scope and spirit of the invention being indicated by the following claims.

What is claimed is:

1. A photonic integrated circuit, comprising:
   a substrate;
   a first plurality of optical paths provided on the substrate, each of the plurality of optical paths including a corresponding one of a first plurality of photodetectors and being configured to output a corresponding one of a first plurality of optical signals, each of the first plurality of optical signals having a corresponding one of a first plurality of wavelengths, each of the first plurality of photodetectors having a corresponding one of a plurality of lengths, such that each of the plurality of optical paths has a corresponding one of a plurality of optical loss values, wherein a minimum one of the plurality of optical loss values is associated with a first one of the first plurality of optical paths and a maximum one of the plurality of optical loss values is associated with a second one of the first plurality of optical paths, the first one of the first plurality of optical paths being spaced from the second one of the first plurality of optical paths by remaining ones of the first plurality of optical paths, a value of each of the plurality of lengths monotonically increasing from a lowest value of the plurality of lengths to a highest value of the plurality of lengths;
   a second plurality of optical paths, each of the plurality of optical paths including a corresponding one of a second plurality of photodetectors and being configured to output a corresponding one of a second plurality of optical signals, each of the second plurality of optical signals having a corresponding one of a second plurality of wavelengths, each of the second plurality of photodetectors having a corresponding one of the plurality of lengths, such that:
   a first one of the first plurality of photodetectors has a first one of the plurality of lengths, and a first one of the second plurality of photodetectors has the first one of the plurality lengths,
   a second one of the first plurality of photodetectors has a second one of the plurality of lengths, and a second one of the second plurality of photodetectors has the second one of the plurality lengths, and
   a third one of the first plurality of photodetectors has a third one of the plurality of lengths, and a third one of the second plurality of photodetectors has the third one of the plurality lengths,
   wherein each of the second plurality of optical paths has a corresponding one of the plurality of optical loss values, and wherein the minimum one of the plurality of optical loss values is associated with a first one of the second plurality of optical paths and the maximum one of the plurality of optical loss values is associated with a second one of the second plurality of optical paths, the first one of the second plurality of optical paths being spaced from the second one of the second plurality of optical paths by remaining ones of the second plurality of optical paths; and
   an optical multiplexer that receives the first and second pluralities of optical signals from the first and second pluralities of photodetectors, each of the first plurality of wavelengths is different than each of the second plurality of wavelengths.

2. A photonic integrated circuit in accordance with claim 1, wherein each of the first plurality of photodetectors has a corresponding one of a plurality of widths.

3. A photonic integrated circuit in accordance with claim 2, wherein each of the plurality of widths monotonically increases from a lowest value of the plurality of widths to a highest value of the plurality of widths.

4. A photonic integrated circuit in accordance with claim 1, wherein each of the first plurality of photodetectors receives a corresponding one of a plurality of biases.

5. A photonic integrated circuit in accordance with claim 1, wherein each of a plurality of optical power values is associated with a corresponding one of the first plurality of optical signals, each of the plurality of optical power values is substantially the same.

6. A photonic integrated circuit in accordance with claim 1, further comprising:
   first and second pluralities of optical sources, each of the first plurality of optical sources supplying a corresponding one of the first plurality of optical signals to a respective one of the first plurality of optical paths and each of the second plurality of optical sources supplying a corresponding one of the second plurality of optical signals to a respective one of the second plurality of optical paths.

7. A photonic integrated circuit in accordance with claim 6, further including the optical multiplexer configured to receive the first and second pluralities of optical signals and output a wavelength division multiplexed optical signal.

8. A photonic integrated circuit in accordance with claim 6, wherein each of the plurality of optical sources includes a distributed feedback laser.

9. A photonic integrated circuit in accordance with claim 1, wherein the photonic integrated circuit includes an arrayed waveguide grating.

10. A photonic integrated circuit, comprising:
   a substrate;
   a first plurality of optical paths provided on the substrate, each of the first plurality of optical paths including a corresponding one of a first plurality of variable optical attenuators and being configured to carry a corresponding one of a first plurality of optical signals, each of the first plurality of optical signals having a corresponding one of a first plurality of wavelengths, each of the first plurality of variable optical attenuators having a corresponding one of a plurality of lengths, each of the plurality of lengths being different from one another, such that:
   a first one of the first plurality of variable optical attenuators has a first one of the plurality of lengths, and a first one of the second plurality of variable optical attenuators has the first one of the plurality lengths,
   a second one of the first plurality of variable optical attenuators has a second one of the plurality of lengths, and a second one of the second plurality of variable optical attenuators has the second one of the plurality lengths, and
   a third one of the first plurality of variable optical attenuators has a third one of the plurality of lengths, and a third one of the second plurality of variable optical attenuators has the third one of the plurality lengths,
   wherein each of the first plurality of optical paths has a corresponding one of a plurality of optical loss values, and wherein a minimum one of the plurality of optical loss values is associated with a first one of the first plurality of optical paths and a maximum one of the plurality of optical loss values is associated with a second one of the first plurality of optical paths, the first one of the first plurality of optical paths being spaced from the second one of the first plurality of optical paths by remaining ones of the first plurality of optical paths, a value of each of the plurality of lengths monotonically increasing from a lowest value of the plurality of lengths to a highest value of the plurality of lengths; and
   a second plurality of optical paths provided on the substrate, each of the second plurality of optical paths including a corresponding one of a second plurality of variable optical attenuators and being configured to carry a corresponding one of a second plurality of optical signals, each of the second plurality of optical signals having a corresponding one of a second plurality of wavelengths, each of the second plurality of variable optical attenuators having a corresponding one of the plurality of lengths, such that each of the second plurality of optical paths has a corresponding one of the plurality of optical loss values, wherein the minimum one of the plurality of optical loss values is associated with a first one of the second plurality of optical paths and a maximum one of the plurality of optical loss values is associated with a second one of the second plurality of optical paths, the first one of the second plurality of optical paths being spaced from the second one of the second plurality of optical paths by remaining ones of the second plurality of optical paths, each of the first plurality of wavelengths being different than each of the second plurality of wavelengths.

* * * * *